United States Patent [19]
Aschwanden

[11] Patent Number: 5,983,088
[45] Date of Patent: Nov. 9, 1999

[54] WIDE FREQUENCY SPECTRUM TELEVISION TUNER WITH SINGLE LOCAL OSCILLATOR

[75] Inventor: Felix Aschwanden, Thalwil, Switzerland

[73] Assignee: RCA Thomson Licensing Corporation, Zurich, Switzerland

[21] Appl. No.: 08/860,989

[22] PCT Filed: Jan. 23, 1996

[86] PCT No.: PCT/IB96/00052

§ 371 Date: Jul. 10, 1997

§ 102(e) Date: Jul. 10, 1997

[87] PCT Pub. No.: WO96/23354

PCT Pub. Date: Aug. 1, 1996

[30] Foreign Application Priority Data

Jan. 23, 1995 [GB] United Kingdom .................... 9501243

[51] Int. Cl.$^6$ .................................................. H04B 1/18
[52] U.S. Cl. .................................. 455/188.2; 455/190.1; 455/323
[58] Field of Search .............................. 455/193.1, 180.1, 455/180.2, 188.1, 188.2, 190.1, 142, 553, 313, 184.1, 323; 375/316, 344; 348/542, 543, 457, 555, 731

[56] References Cited

U.S. PATENT DOCUMENTS

| | | | |
|---|---|---|---|
| 3,931,578 | 1/1976 | Gittinger | 455/190.1 |
| 4,079,415 | 3/1978 | Will | 358/86 |
| 4,551,856 | 11/1985 | Victor et al. | 455/183.2 |
| 4,581,643 | 4/1986 | Carlson | 358/191.1 |
| 4,667,243 | 5/1987 | Blatter et al. | 358/191.1 |
| 4,835,792 | 5/1989 | Davarian | 455/142 |
| 5,029,237 | 7/1991 | Ragan | 455/182 |
| 5,121,057 | 6/1992 | Huber et al. | 324/212 |
| 5,220,684 | 6/1993 | Suizu | 455/183.1 |
| 5,630,214 | 5/1997 | Yamamoto et al. | 455/190.1 |
| 5,761,615 | 6/1998 | Jaffee | 455/314 |
| 5,793,799 | 8/1998 | Armbruster et al. | 375/216 |

FOREIGN PATENT DOCUMENTS

| | | |
|---|---|---|
| 0396103 | 11/1990 | European Pat. Off. . |
| 3830921 | 3/1990 | Germany . |
| 2130826 | 6/1984 | United Kingdom . |

OTHER PUBLICATIONS

8640B Signal Generator, Hewlett Packard Operating and Service Manual, Apr. 1978.

Primary Examiner—Reinhard J. Eisenzopf
Assistant Examiner—Duc Nguyen
Attorney, Agent, or Firm—Joseph S. Tripoli; Peter M. Emanuel; Frederick A. Wein

[57] ABSTRACT

A tuner includes a conversion (or heterodyning) stage, including a local oscillator and a mixer, for converting an RF signal corresponding to a selected channel to an IF signal. The local oscillator has only one tunable oscillating portion for generating a signal, and a frequency converter, such as a controllable frequency divider, for converting the frequency of the signal generated by said oscillating portion, so that the receiver is able to tune through the UHF and VHF bands. The operation of the requency converter is responsive to a digital controller, such as a microprocessor.

6 Claims, 4 Drawing Sheets

WIDE FREQUENCY SPECTRUM TELEVISION TUNER WITH SINGLE LOCAL OSCILLATOR

FIELD OF THE INVENTION

The present invention concerns a television receiver having a conversion tuner for producing an intermediate frequency signal from an RF source signal.

BACKGROUND

It is a common practice to use more than one local oscillator to tune the full frequency range of television RF sources, which for a television receiver in the United States, can extend from 55 MHz of channel 2 of the lower VHF band to 847 MHz of channel 69 of the UHF band, a frequency range of more than 17:1. This requires that the local oscillators for conventional all band TV tuners cover a wide frequency range of from approximately 90 MHz up to almost 1 GHz.

It is desirable that a local oscillator not be required to tune over more than a range of 2:1, with an outside limit of about 3:1, due to problems of assuring that the oscillator will oscillate, reliability of frequency and signal amplitude of the generated oscillator signal over the wide spectrum, and tracking problems, since other circuits, e.g., tunable filters, must track as the local oscillator frequency is changed. Further, varactor diodes, which typically are used to tune the local oscillator, have a limited range of adjustment and become non-linear in the low capacitance part of their adjustment range. For these reasons, in a television receiver, at a minimum, two local oscillators are often used with each covering only part of the tunable spectrum, e.g., one for the VHF band and the other for the UHF band.

It is further desirable that a single oscillator be used in order to eliminate beat frequency problems between oscillators, which requires that oscillators not in use be turned off. Still further, a reduced number of oscillators would result in reduced components, reduced printed circuit space, and reduced cost.

A known apparatus which reduces the local oscillator tuning range is described by H. Fuchs in DE 38 30 921 entitled ARRANGEMENT FOR ADAPTING A RECEIVER TO DIFFERENT CHANNEL RASTERS. Fuchs describes apparatus for generating a conversion signal for a mixer which includes a variable oscillator for generating a first RF signal over a predetermined frequency range, a divider for converting the frequency of the first RF signal in accordance with a binary number, N, to provide a second RF signal having a frequency range which varies as a function of the binary number, N, for application to the mixer; and a microprocessor for selecting values of the binary number, N, to provide a respective frequency range for the second RF signal for each selected value of the binary number, N, for the purpose of reducing memory requirements in a multi-stantard television receiver.

In certain applications, such as applications requiring quadrature demodulation, it would be desirable to provide a quadrature phase shifted output signal for a second mixer. An example of a digital quadrature phase shift generator is described by Huber et al. in U.S. Pat. No. 5121057 entitled MEDIA FLAW DETECTION APPARATUS FOR A MAGNETIC DISC DRIVE WITH SQUARING AND SUMMING OF IN-PHASE AND QUADRATURE-PHASE DETECTED SIGNALS. The Huber et al. apparatus includes a divide-by- four circuit for generating in-phase and quadrature signals for application to respective mixers.

SUMMARY OF THE INVENTION

It is herein recognized that a problem exists in mixer signal generation in that where mixer signal generation involves digital phase shifting, that local oscillator frequency range requirements may require operation of the local oscillator in a frequency range that is greater than that required for conversion in the mixer.

It is an object of the present invention to provide an apparatus and a method for generating a conversion signal for a mixer which minimizes the highest frequency range necessary for a local oscillator to cover to provide the mixer signal.

Apparatus, in accordance with the invention applies to mixer signal generators of a type including a variable oscillator means for generating a first RF signal over a predetermined frequency range; a frequency conversion means for converting the frequency of the first RF signal in accordance with a binary number, N, to provide a second RF signal having a frequency range which varies as a function of the binary number, N, for application to the mixer; and a control means for selecting values of the binary number, N, to provide a respective frequency range for the second RF signal for each selected value of the binary number, N.

Apparatus embodying the invention is characterized by first means for applying digital phase shift to the second RF signal to produce a digitally phase shifted signal; second means for applying analog phase shift to the second RF signal to produce an analog phase shifted signal; and third means for selecting the analog phase shifted signal for application to the mixer as the second RF signal at frequencies above a given, frequency and for selecting the digitally phase shifted signal for application to the mixer as the second RF signal at frequencies below the given frequency.

In accordance with a feature of the invention, the control means selects a value of unity, N=1, for the binary number; and the third means selects the analog phase shifted signal for application to the mixer whereby the second RF signal supplied to the mixer occupies a frequency range equal to that of the first RF signal produced by the variable oscillator means.

In accordance with a further feature of the invention, the first means comprises means for applying true and complemented versions of the first RF signal to respective inputs of a first divider and a second divider; and means for applying an output of the first divider to a control input of the second divider for producing at an output of the second divider a phase shifted second RF signal for application to the mixer having a frequency equal to one-half of that of the first RF signal produced by the variable oscillator means.

A method, in accordance with the invention, applies to mixer signal generation of a type including the steps of: generating a first RF signal over a predetermined frequency range; converting the frequency of the first RF signal in accordance with a binary number, N, to provide a second RF signal having a frequency range which varies as a function of the binary number, N, for application to the mixer; and selecting values of the binary number, N, to provide a respective frequency range for the second RF signal for each selected value of the binary number, N.

The method, in accordance with the present invention is characterized by the further steps of: applying digital phase shift to the second RF signal to produce a digitally phase shifted signal; applying analog phase shift to said second RF signal to produce an analog phase shifted signal; and selecting the analog phase shifted signal for application to the mixer as the second RF signal at frequencies above a given frequency and for selecting the digitally phase shifted signal for application to the mixer as the second RF signal at frequencies below the given frequency.

In accordance with a feature of the invention, the method is further characterized by selecting a value of unity, N=1, for the binary number; and concurrently selecting the analog phase shifted signal for application to the mixer whereby the second RF signal supplied to the mixer occupies a frequency range equal to that of the first RF signal.

In accordance with yet another feature of the method of the invention, the method step of applying digital phase shift to the second RF signal comprises: applying true and complemented versions of the first RF signal to respective inputs of a first divider and a second divider; and applying an output of the first divider to a control input of the second divider for producing at an output of the second divider the analog phase shifted second RF signal for application to the mixer, the analog phase shifted second RF signal having a frequency equal to one-half of that of the first RF signal produced by the variable oscillator means.

DETAILED DESCRIPTION OF THE PREFERRED EMBODIMENTS

A tuner 1 selects the RF signal corresponding to a selected channel from the plurality of RF signals provided by an RF source 3 and converts the selected RF signal to a corresponding IF signal in the conventional IF frequency range (e.g., in the United States between 41 and 46 MHz). RF source 3 may, for example, comprise a television broadcast receiving antenna, a cable distribution network, a video cassette recorder, a video disc player, or a home computer. The IF signal produced by tuner 1 is demodulated and separated into luminance, synchronization, chrominance and audio components by a video and audio signal processing unit 5. The various components are further processed by video and audio signal processing unit 5 to produce the video and audio responses corresponding to the selected channel.

Figure 1:
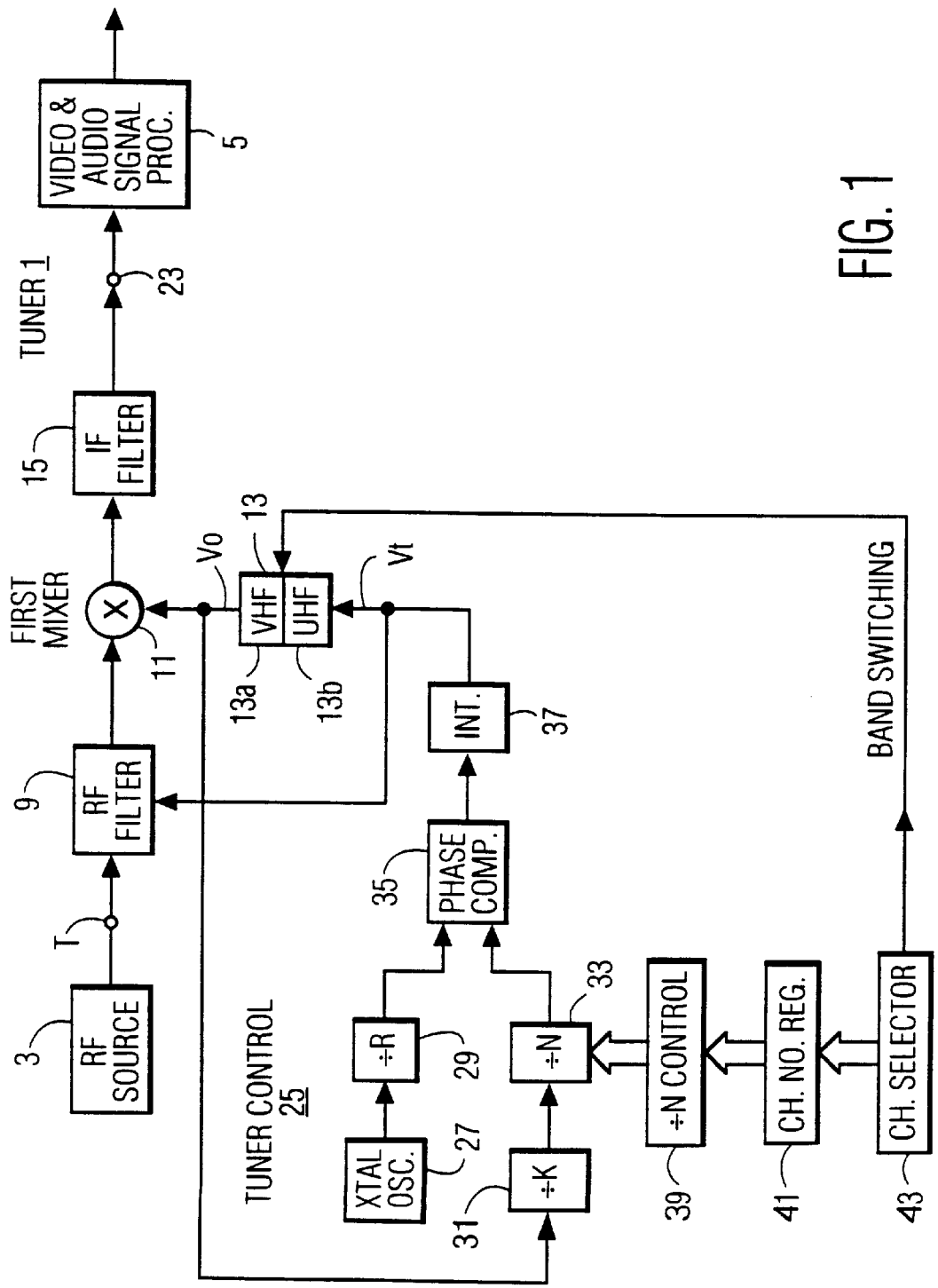
FIG. 1 shows, in block diagram form, a prior art television tuner wherein a phase locked loop (PLL) is used to control a voltage controlled oscillator (VCO) serving as a first local oscillator (LO) in combination with a mixer for converting an RF input signal to an IF signal.

The present tuner includes an RF input terminal 7 to which the RF source 3 is connected. The RF signals received at terminal 7 are filtered by an RF filter section 9 to select the RF signal corresponding to the selected channel and the resultant RF signal is coupled to a first mixer 11. A local oscillator (LO) signal having a nominal frequency corresponding to the selected channel is generated by an LO 13 and also coupled to first mixer 11. As shown in FIG. 1, LO 13 comprises a VHF local oscillator 13a and a VHF local oscillator 13b, with the appropriate oscillator being chosen by the bandswitching signal from channel selector 43, depending upon which channel is selected. Mixer 11 heterodynes the selected RF signal and the LO signal to produce an IF signal. Mixer 11 produces the sum and difference frequency products of the LO signal and the selected RF signal. The IF signal is coupled to an IF filter stage 15 which has a passband response selected to pass the difference frequency product of the LO signal and the selected RF signal. The frequencies of the LO signal determine the frequency range of the IF signal.

LO 13 is a voltage controlled oscillator and RF filter 9 are controlled in response to the magnitude of a tuning control voltage Vt. The magnitude of the tuning control voltage Vt is controlled in accordance with the selected channel by a tuner control section 25 including a phase locked loop (PLL). In the PLL, the frequency of the output signal of a crystal oscillator 27 is divided by a frequency divider (÷R) 29 to produce a frequency reference signal. The PLL also includes a frequency divider (÷K) 31 and a frequency divider (÷N) 33 for dividing the frequency of the local oscillator signal to produce a frequency divided version of the LO signal. The frequency reference signal and the frequency divider local oscillator signal are compared by a phase comparator 35 to produce a pulse signal which represent the magnitude and sense of frequency deviation between them. The pulse error signal is filtered by an integrator 37, which serves as a low pass filter, to produce the tuning control voltage Vt for LO 13. The magnitude of the tuning control voltage is changed until the frequency of the frequency reference signal and the frequency divided LO signal are substantially equal.

Division factor R of divider 29 is selected to determine the frequency (FREF) of the frequency reference signal. Division factor K of divider 31 is selected to reduce the frequency of the relatively high frequency LO signal before further processing and determines together with division factor R the division factor K. Division factor N of divider 33 is controlled by a control unit 39 to set the frequency of the first LO signal in accordance with the binary representation of the channel number of the desired channel stored in a register 41. The binary representation of the channel number is entered into channel number register 41 in response to a user's operation of a channel selector 43, which may, for example, comprise a calculator-like keyboard by which the user may enter in sequence the tens and units digits of the channel number of the desired channel.

Figure 2:
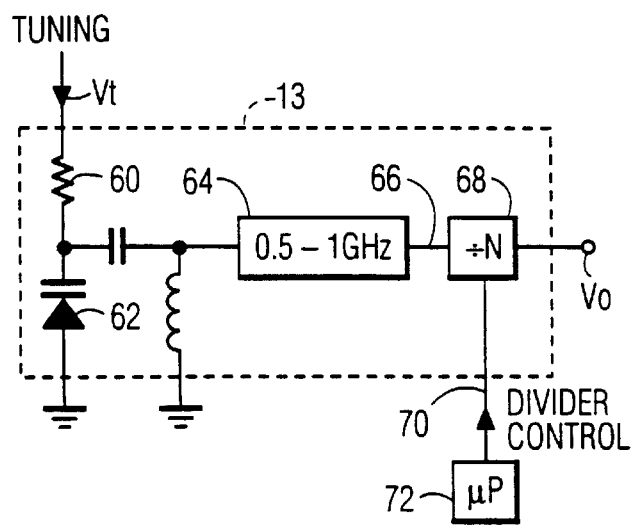
FIG. 2 shows, in block diagram form, a VCO according to aspects of the present invention, including an oscillatory portion and a count down divider in a cascade arrangement.

One aspect of the present invention, shown in FIG. 2, presents an embodiment of a local oscillator, e.g., local oscillator 13, which is able to tune over the wide frequency range of frequencies necessary for a television receiver, as discussed above in the background section.

Tuning voltage Vt (see FIG. 1) is applied through an appropriate resistor 60 to varactor diode 62 for varying the capacitance of varactor diode 62 for tuning oscillating portion 64 of VCO 13, which in the exemplary embodiment, is an oscillator which can be tuned from 0.5 to 1 GHz. The output signal 66 from oscillator 64 is coupled to a frequency divider control 68, which is a programmable binary counter which divides the oscillatory signal of oscillator 64 by a binary number in response to a divider control signal applied to terminal 70. The divider control signal at terminal 70 can be provided by tuning control microprocessor 72 or it can be derived from channel selector 43 of FIG. 1 (not shown).

For a division number of 1, the output signal Vo is the same frequency as the frequency of oscillator 64, i.e., 500 to 1000 MHz tuned by Vt, and the frequency divider can be considered as a divider bypass. For the oscillating frequency range of 500 MHz to 1000 MHz, as the division number of divider control 68 increases, the frequency of signal Vo decreases, as follows:

| Division Number of divider 68 | Frequency of Vo |
|---|---|
| N = 2 | F = 250 MHz to 500 MHz |
| 4 | 125 MHz to 250 MHz |
| 8 | 62.5 MHz to 128 MHz |
| 16 | 31.25 MHz to 62.5 MHz |

The value of N is chosen for groups of channels and is changed when the channel chosen is in a different group. This table is an illustration as to the relationship of the frequency of the oscillating portion 64 to the frequency of output signal Vo with a change of division number for divider 68. The frequency and range of oscillation of the oscillating portion 64 can be adjusted as required. Additionally, the frequencies chosen for Vo depend upon whether the sum or difference signals from the mixer are used as the IF signal.

In the alternative, oscillating portion 64 can oscillate at a much lower frequency, e.g., at a VHF frequency, and control 68 can be a frequency multiplier (not shown), e.g., a doubler or a tripler. In which case, Vo can achieve frequencies higher than the frequency signal generated by oscillatory portion 64.

Figure 3:
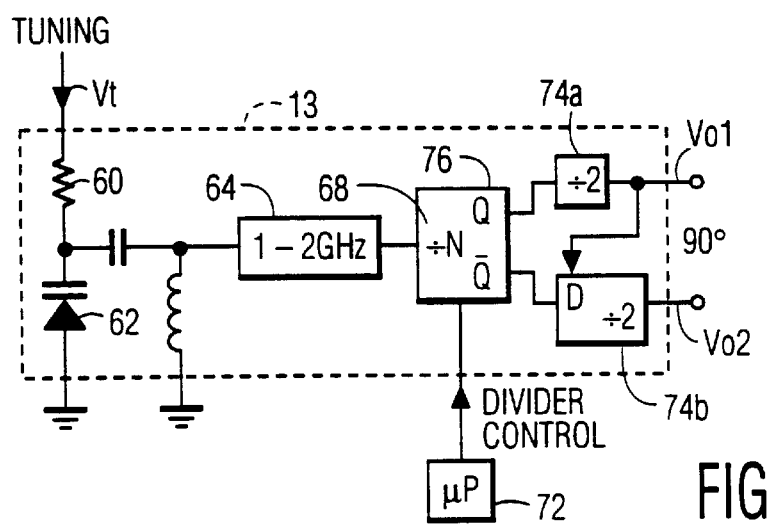
FIG. 3 shows, in block diagram form according to aspects of the present invention, an alternate embodiment of the local oscillator of FIG. 2, which is suitable for use in a direct conversion tuner.
Figure 4:
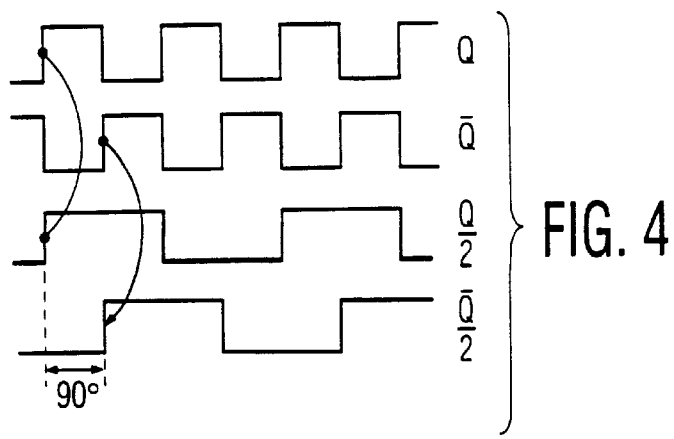
FIG. 4 shows wave shapes found in the oscillator of FIG. 3.

Another embodiment is shown in FIG. 3. The embodiment of FIG. 3 has two additional divide by 2 circuits 74a, 74b and 90 degree phase shifted clocks 76 to obtain two output signals of quadrature phase Vo1, Vo2 which are useful for direct conversion tuners discussed in connection with FIG. 6 below. The wave forms of the embodiment of FIG. 3 are shown in FIG. 4 and show how the 90° degree phase shifted clocks 76 are obtained, using Q and not-Q clocks and dividing them both by two. The connection from the output of divider 74a synchronizes the two dividers 74a, 74b such that the clock of 74a always leads. This embodiment shows an additional division by dividers 74a, 74b and thus, the voltage controlled oscillator 64 is tunable between the higher frequencies of 1 GHz to 2 GHz.

Figure 5:
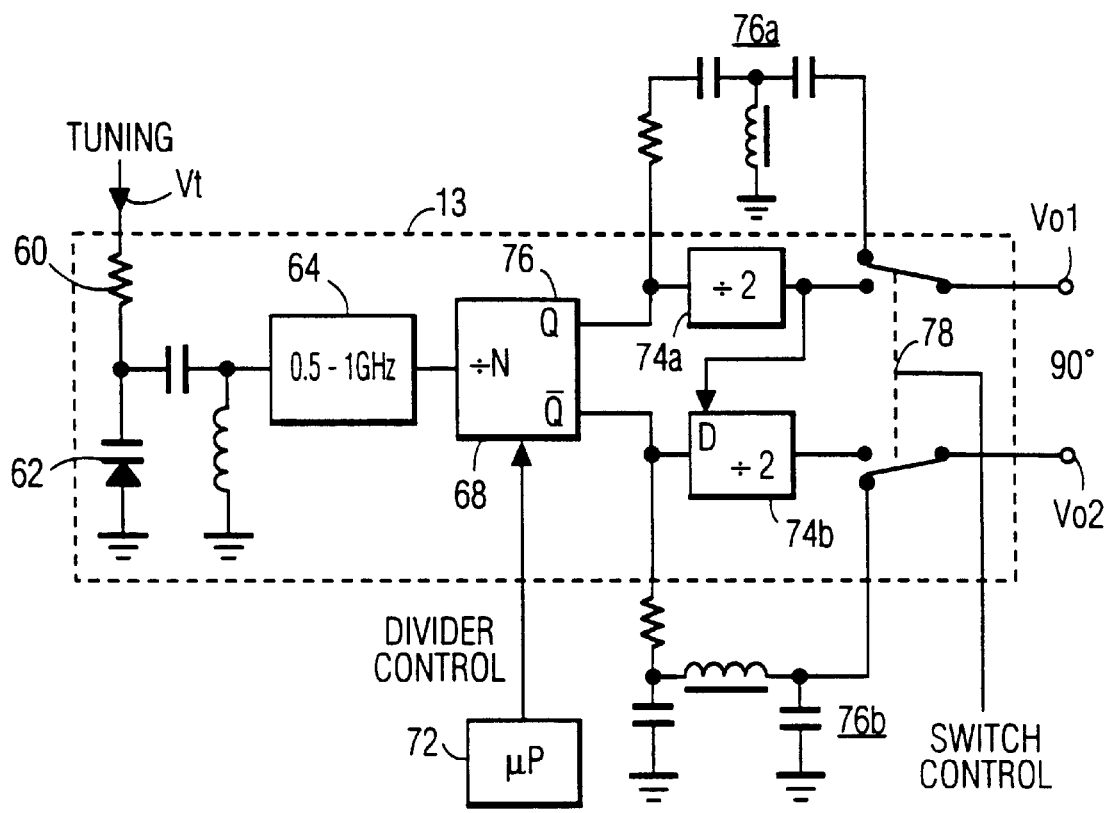
FIG. 5 shows, in block diagram form according to aspects of the present invention, another alternate embodiment of the oscillator of FIG. 2, which is suitable for use in a direct conversion tuner.

Another alternate embodiment with respect to FIG. 3, of a VCO 13 for a direct conversion tuner discussed in connection with FIG. 6 below, is shown in FIG. 5 wherein the quadrature phase signals Vo1, Vo2 for the UHF band is accomplished by two discrete LC phase shifter networks 76a, 76b for output frequencies at Vo1, Vo2 above 500 MHz. For local oscillator frequencies below 500 MHz, the arrangement is switched so that the quadrature phase signals Vo1, Vo2 are produced by the divide by 2 divider as previously described with reference to FIG. 3. The output signals Vo1, Vo2 are switched between the external components and the extra dividers 74a and 74b by switch 78.

Figure 6:
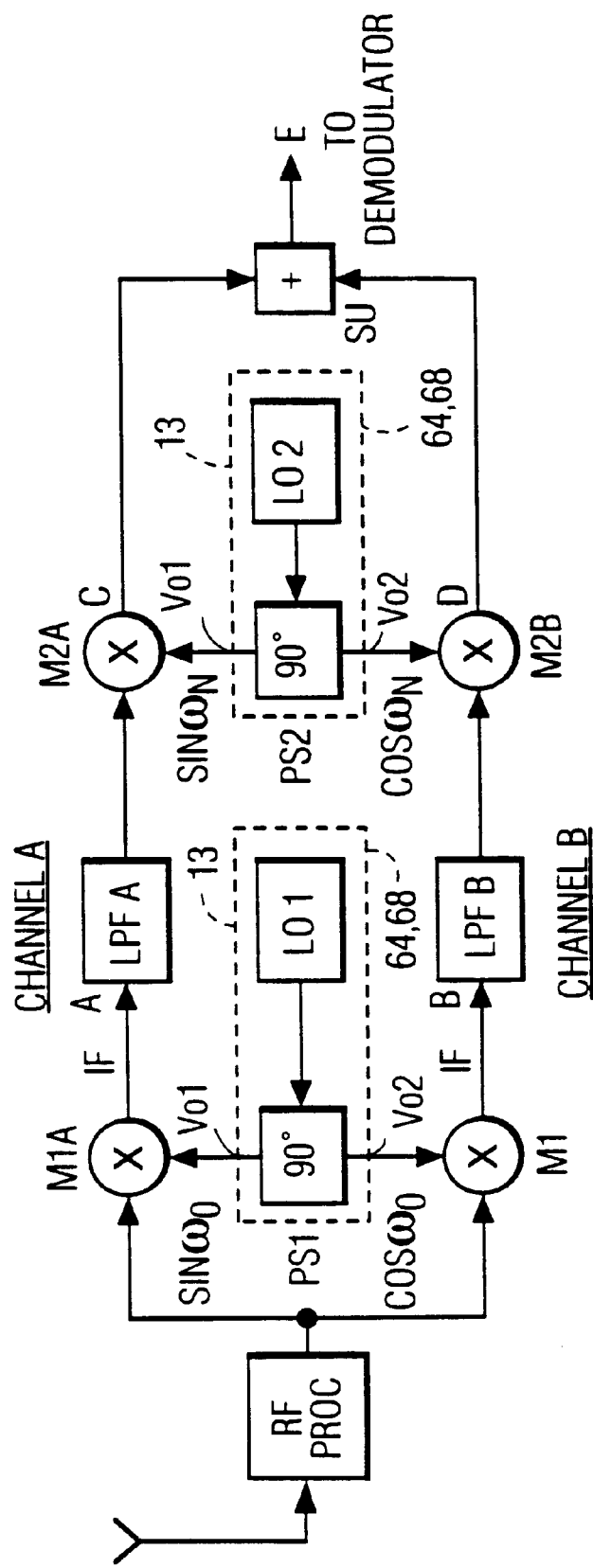
FIG. 6 shows, in block diagram form, a direct conversion tuner suitable for using the embodiments shown in FIGS. 3 and 5.

FIG. 6 shows a direct conversion tuner according to PCT patent application No. 94/00138. Basically, the direct conversion tuner contains two channels, each with two conversion stages. The received RF signal is coupled to each of two mixers M1A and M1B via a tuned RF amplifier which provides gain and some selectivity. Desirably, the gain of the RF amplifier is automatically controlled in response to an automatic gain control (AGC) signal (not shown). The first local oscillator signal generated by a first local oscillator LO1, such as shown in FIGS. 3 and 5 discussed above, is tuned to the center frequency wO of the frequency band of the desired channel between the lower sided band (LSB) and the upper side band (USB). The first local oscillator signal is provided in quadrature components, Vo1, Vo2, that are used to drive mixers M1A and M1B. The respective IF output signals of mixers M1A and M1B are filtered by two low pass filters LPF A and LPF B. Low pass filters LPF A and LPF B provide the necessary selectivity to reject the responses from the adjacent channels and higher order products of mixers M1A and M1B.

Each of the output signals of mixers M1A and M1B includes both a lower side band portion and an upper side band portion corresponding to the LSB and USB portions of the received RF signal. The output signal of low pass filters LPF A and LPF A are coupled to respective ones of a second pair of mixers M2A and M2B. Mixers M2A and M2B are driven by respective ones of a second pair of quadrature local oscillator signals generated by a second local oscillator LO2, such as shown in FIGS. 3 and 5. Each of the second local oscillator signals has a frequency wN located above the cutoff frequency of the low pass filters LPF A and LPF B filters to fulfill the Nyquist criteria. The output signals of mixers M2A and M2B are added in a summer unit SU to produce an output signal. This output signal is coupled to a demodulator (not shown) for demodulation, and the demodulated resultant is coupled to further signal processing sections.

What is claimed is:

1. Apparatus for generating a conversion signal for a mixer, comprising:

variable oscillator means for generating a first RF signal over a predetermined frequency range;

frequency conversion means for converting the frequency of said first RF signal in accordance with a binary number, N, to provide a second RF signal having a frequency range which varies as a function of said binary number, N, for application to said mixer; and control means for selecting values of said binary number, N, to provide a respective frequency range for said second RF signal for each selected value of said binary number, N;

first means for applying digital phase shift to said second RF signal to produce a digitally phase shifted signal;

second means for applying analog phase shift to said second RF signal to produce an analog phase shifted signal; and third means for selecting said analog phase shifted signal for application to said mixer as said second RF signal at frequencies above a given frequency and for selecting said digitally phase shifted signal for application to said mixer as said second RF signal at frequencies below said given frequency.

2. Apparatus as recited in claim 1 wherein for operation within a highest frequency range of said apparatus: said control means selects a value of unity, N=1, for said binary number; and said third means selects said analog phase shifted signal for application to said mixer whereby said second RF signal supplied to said mixer occupies a frequency range equal to that of said first RF signal produced by said variable oscillator means.

3. Apparatus as recited in claim 1 wherein said first means comprises:

means for applying true and complemented versions of said first RF signal to respective inputs of a first divider and a second divider; and means for applying an output of said first divider to control input of said second divider for producing at an output of said second divider a phase shifted second RF signal for application to said mixer having a frequency equal to one-half of that of said first RF signal produced by said variable oscillator means.

4. A method for generating a conversion signal for a mixer, comprising:

generating a first RF signal over a predetermined frequency range;

converting the frequency of said first RF signal in accordance with a binary number, N, to provide a second RF signal having a frequency range which varies as a function of said binary number, N, for application to said mixer;

selecting values of said binary number, N, to provide a respective frequency range for said second RF signal for each selected value of said binary number, N;

applying digital phase shift to said second RF signal to produce a digitally phase shifted signal;

applying analog phase shift to said second RF signal to produce an analog phase shifted signal; and selecting said analog phase shifted signal for application to said mixer as said second RF signal at frequencies above a given frequency and for selecting said digitally phase shifted signal for application to said mixer as said second RF signal at frequencies below said given frequency.

5. A method as recited in claim 4 further comprising:

selecting a value of unity, N=I, for said binary number; and concurrently selecting said analog phase shifted signal for application to said mixer (MI) whereby said second RF signal supplied to said mixer occupies a frequency range equal to that of said first RF signal.

6. A method as recited in claim 4 wherein the step of applying digital phase shift to said second RF signal comprises:

applying true and complemented versions of said first RF signal to respective inputs of a first divider and a second divider; and applying an output of said first divider to a control input of said second divider for producing at an output of said second divider, said analog phase shifted second RF signal for application to said mixer, said analog phase shifted second RF signal having a frequency equal to one-half of that of said first RF signal produced by said variable oscillator means.

\* \* \* \* \*